(12) United States Patent  (10) Patent No.: US 8,987,975 B2
Murakami et al.  (45) Date of Patent: Mar. 24, 2015

(54) LEAD TYPE PIEZOELECTRIC RESONATOR DEVICE

(75) Inventors: Tatsuya Murakami, Kakogawa (JP); Tadataka Koga, Kakogawa (JP); Koichi Kishimoto, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 127 days.

(21) Appl. No.: 13/263,054

(22) PCT Filed: Dec. 3, 2010

(86) PCT No.: PCT/JP2010/071684
§ 371 (c)(1),
(2), (4) Date: Oct. 5, 2011

(87) PCT Pub. No.: WO2011/068200
PCT Pub. Date: Jun. 9, 2011

(65) Prior Publication Data
US 2012/0235544 A1 Sep. 20, 2012

(30) Foreign Application Priority Data
Dec. 4, 2009 (JP) .................................. 2009-276718

(51) Int. Cl.
*H01L 41/047* (2006.01)
*H03H 9/05* (2006.01)
(Continued)

(52) U.S. Cl.
CPC ........... *H01L 41/047* (2013.01); *H03H 9/0509* (2013.01); *H03H 9/1021* (2013.01); *H03H 9/215* (2013.01)
USPC ............ 310/364; 310/363; 310/365; 310/366

(58) Field of Classification Search
CPC . H01L 41/047; H01L 41/083; H01L 41/0926; H03H 9/131
USPC .................................. 310/363, 364, 365, 366
See application file for complete search history.

(56) References Cited

U.S. PATENT DOCUMENTS

2003/0193094 A1* 10/2003 Takahashi et al. ............ 257/780
2007/0215379 A1*  9/2007 Komatsu et al. .............. 174/258
(Continued)

FOREIGN PATENT DOCUMENTS

JP          64-000809 A      1/1989
JP        2001-009587 A      1/2001
(Continued)

OTHER PUBLICATIONS

Japanese office action letter issued on Jan. 20, 2015 in the counterpart JP patent application.

*Primary Examiner* — Thomas Dougherty
*Assistant Examiner* — Bryan Gordon
(74) *Attorney, Agent, or Firm* — Marvin A. Motsenbocker; Mots Law, PLLC

(57) ABSTRACT

A lead type piezoelectric resonator device includes a piezoelectric resonator plate and a lead terminal that supports the piezoelectric resonator plate. The piezoelectric resonator plate is provided with a terminal electrode that is electrically connected to the lead terminal, and the lead terminal is provided with a bonding layer that is electrically connected to the piezoelectric resonator plate. The piezoelectric resonator plate and the lead terminal are electromechanically bonded to each other by the terminal electrode and the bonding layer. A bonding material containing an Sn—Cu alloy is produced from the terminal electrode and the bonding layer by the bonding of the terminal electrode and the bonding layer.

8 Claims, 10 Drawing Sheets

(51) Int. Cl.
*H03H 9/10* (2006.01)
*H03H 9/215* (2006.01)

(56) References Cited

U.S. PATENT DOCUMENTS

2008/0218034 A1* 9/2008 Mai .................. 310/364
2009/0108709 A1* 4/2009 Tsuchido ............ 310/364
2009/0267460 A1* 10/2009 Satoh et al. .......... 310/365
2010/0079038 A1* 4/2010 Jeon et al. ........... 310/364

FOREIGN PATENT DOCUMENTS

| JP | 2001-015188 A | 1/2001 |
| JP | 2008-028590 A | 2/2008 |
| JP | 2008-131162 A | 6/2008 |
| WO | WO 2007/023685 A1 | 3/2007 |

* cited by examiner

LEAD TYPE PIEZOELECTRIC RESONATOR DEVICE

TECHNICAL FIELD

The present invention relates to a lead type piezoelectric resonator device.

BACKGROUND ART

A lead type piezoelectric resonator device is provided with a piezoelectric resonator plate, a pair of lead terminals that holds the piezoelectric resonator plate, a base in which the lead terminals are implanted and on which the piezoelectric resonator plate is mounted, and a cap that hermetically seals the piezoelectric resonator plate mounted on the base. With such a lead-terminal type piezoelectric resonator device, a package is made up of the base and the cap, the base and the cap being bonded to each other so as to form a hermetically sealed internal space. In the internal space, the crystal resonator plate is electromechanically bonded to the lead terminals by, for example, applying solder (see Patent Document 1, for example).

PRIOR ART DOCUMENT

Patent Document

[Patent Document 1] JP2007-37003A

SUMMARY OF INVENTION

Problem to be Solved by the Invention

However, there is a problem with the lead-terminal type piezoelectric resonator device disclosed in Patent Document 1 in that solder may be melted by heat generated at the time of reflow (for example, at the time of bonding the base and the cap, or when the lead-terminal type piezoelectric resonator device is placed on an external substrate such as a printed circuit board) and thereby the piezoelectric resonator plate may be detached from the lead terminals and fall down.

In particular, in the case of using solder made of a lead-free material (hereinafter referred to as "lead-free solder"), the application of only the lead-free solder, which has low heat resistance, is not enough to prevent the piezoelectric resonator plate from being detached from the lead terminals and falling down at the time of reflow.

In view of this, some currently used techniques employ a resin adhesive in order to prevent the piezoelectric resonator plate from being detached from the lead terminals at the time of reflow and to thereby ensure the reliability of the lead type piezoelectric resonator device, but in this case, another problem arises in that the resin adhesive produces gas, and the produced gas degrades the characteristics of the piezoelectric resonator device.

Therefore, in order to solve the above-described problem, it is an object of the present invention to provide a lead type piezoelectric resonator device that suppresses detachment of a piezoelectric resonator plate from a lead terminal even at the time of reflow and provides favorable characteristics including excellent heat resistance.

Means for Solving the Problems

In order to achieve the object described above, a lead type piezoelectric resonator device according to the present invention includes a piezoelectric resonator plate, and a lead terminal that supports the piezoelectric resonator plate, the piezoelectric resonator plate being provided with a terminal electrode that is electrically connected to the lead terminal, and the lead terminal being provided with a bonding layer that is electrically connected to the piezoelectric resonator plate, wherein the piezoelectric resonator plate and the lead terminal are electromechanically bonded to each other by the terminal electrode and the bonding layer, and a bonding material that contains an intermetallic compound is produced from the terminal electrode and the bonding layer by the bonding of the terminal electrode and the bonding layer.

According to the present invention, because the terminal electrode and the bonding layer are bonded to each other by the bonding material that contains the intermetallic compound having a higher melting temperature than lead-free solder or the like, heat resistance of the bonding material can be improved. Thus, at least the intermetallic compound enables the lead terminal to support the piezoelectric resonator plate even at the time of reflow. For this reason, according to the present invention, the bonding material including the intermetallic compound can suppress detachment of the piezoelectric resonator plate from the lead terminal even at the time of reflow. Furthermore, according to the present invention, since a resin adhesive as used in conventional technologies is not used for supporting the piezoelectric resonator plate by the lead terminal, it is possible to suppress degradation in the characteristics of the lead type piezoelectric resonator device.

With this configuration, the intermetallic compound may be eccentrically-located in a narrowest gap between the piezoelectric resonator plate and the lead terminal.

In this case, since the intermetallic compound is eccentrically-located in the narrowest gap between the piezoelectric resonator plate and the lead terminal, the eccentrically-located intermetallic compound enables electromechanical bonding between the piezoelectric resonator plate and the lead terminal while withstanding the environmental temperature at the time of reflow.

With this configuration, the narrowest gap between the piezoelectric resonator plate and the lead terminals may be in the range of 3 to 20 μm.

In this case, the narrowest gap of 3 to 20 μm enables the intermetallic compound to be eccentrically-located in the narrowest gap in good condition and further enables the bonding material to be kept in a fillet shape, which is favorable for bonding. Therefore, this configuration enables the piezoelectric resonator plate and the lead terminal to be firmly bonded to each other via the bonding material including the intermetallic compound, which is preferable for reducing the size of the lead type piezoelectric resonator device. In contrast, the narrowest gap of less than 3 μm makes the gap portion fragile and thereby reduces the strength of the bonding material. Also, the narrowest gap of more than 20 μm makes small the fillet of the bonding material formed on the piezoelectric resonator plate and thereby reduces the strength of bonding between the piezoelectric resonator plate and the lead terminal. This may further relatively reduce the amount of the intermetallic compound generated in the bonding material, thus reducing heat resistance.

With this configuration, the bonding layer may contain Cu and Sn.

In this case, since the bonding layer contains Cu and Sn, Cu and Sn dispersed in the bonding layer are linked to each other (e.g., $Cu_6Sn_5$ or $Cu_3Sn$) in bonding the terminal electrode and the bonding layer, and accordingly an intermetallic compound composed of Cu and Sn is eccentrically-located. In the case where Cu and Sn of the bonding layer have already been linked to each other (in the case where the above intermetallic compound already exists), this intermetallic compound composed of Cu and Sn is eccentrically-located.

With this configuration, the bonding layer may be constituted by a first bonding layer made of Cu, and a second bonding layer made of Cu and Sn and formed on the first bonding layer.

In this case, since the bonding layer is constituted by the first bonding layer composed of CU and the second bonding layer composed of Cu and Sn and formed on the first bonding layer, Cu of the first bonding layer is supplied to Sn of the second bonding layer during bonding (during heating). This consequently accelerates generation of a new intermetallic compound, thus improving the heat resistance of the bonding material.

With this configuration, a Cu layer made of Cu may be formed as an uppermost layer of the terminal electrode.

In this case, since a Cu layer composed of Cu is formed as the uppermost layer of the terminal electrode, Sn of the bonding layer is diffused into the Cu layer of the terminal electrode in bonding the terminal electrode and the bonding layer, and accordingly Sn of the bonding layer and Cu of the Cu layer of the terminal electrode produce the intermetallic compound that has heat resistance to an environmental temperature at the time of reflow.

With this configuration, the terminal electrode may have a barrier layer for blocking diffusion of Sn formed between the Cu layer and the Cu—Sn layer.

In this case, since the terminal electrode has a barrier layer formed between its Cu layer and Cu—Sn layer, the barrier layer prevents Sn of the bonding layer from diffusing into the Cu layer of the terminal electrode in bonding the terminal electrode and the bonding layer. This consequently prevents Sn of the bonding layer and Sn of the terminal electrode from eroding the undermost Cu layer of the terminal electrode, thus suppressing exfoliation of the terminal electrode from the crystal resonator plate which may be caused by erosion of the Cu layer due to Sn.

With this configuration, the bonding material may contain Sn, and the piezoelectric resonator plate may be provided with an excitation electrode that is connected to the terminal electrode via a thin film having lower wettability than the excitation electrode.

In this case, it is possible to suppress the possibility that Sn of the bonding material may erode the excitation electrode from the terminal electrode via the thin film.

Effects of the Invention

According to the present invention, it is possible to prevent the piezoelectric resonator plate from being detached from the lead terminals and falling down even at the time of reflow.

MODE FOR CARRYING OUT THE INVENTION

The following is a description of embodiments of the present invention with reference to the drawings. Note that the following description of the embodiments takes the example of a case where the present invention is applied to a lead type crystal resonator serving as a lead type piezoelectric resonator device.

Figure 1:
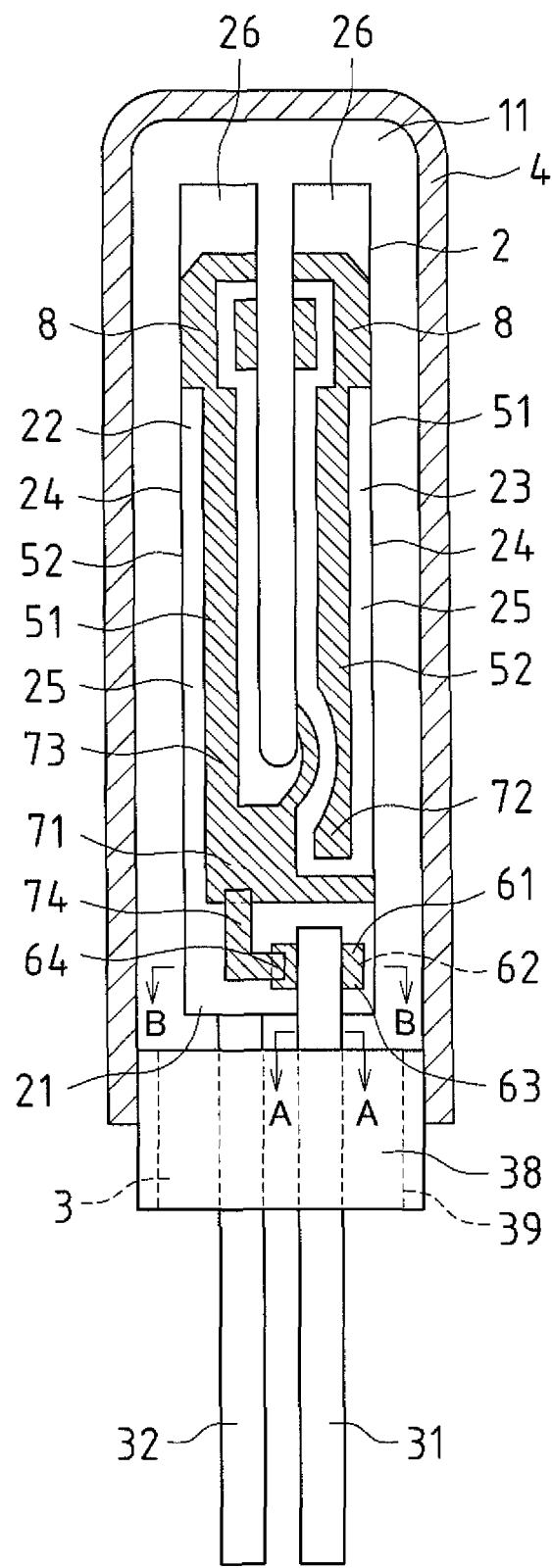
FIG. 1 is a schematic side view showing a cutaway illustration of an internal space of a crystal resonator according to an embodiment.

As shown in FIG. 1, a lead type crystal resonator (hereinafter referred to as a "crystal resonator 1") according to an embodiment is provided with a tuning fork-shaped crystal resonator plate (a so-called piezoelectric resonator plate in the present invention; hereinafter referred to as a "crystal resonator plate 2"), a pair of lead terminals 31 and 32 that supports the crystal resonator plate 2, a base 3 in which the lead terminals 31 and 32 are implanted and at which the crystal resonator plate 2 is mounted, and a cap 4 that hermetically seals the crystal resonator plate 2 mounted at the base 3.

With the crystal resonator 1, a package is made up of the base 3 and the cap 4, the base 3 and the cap 4 being bonded to each other so as to form a hermetically sealed internal space 11. In the internal space 11, the crystal resonator plate 2 is electromechanically bonded to only the lead terminals 31 and 32. In the present embodiment, the crystal resonator plate 2 is not in direct contact with the base 3.

Figure 2:
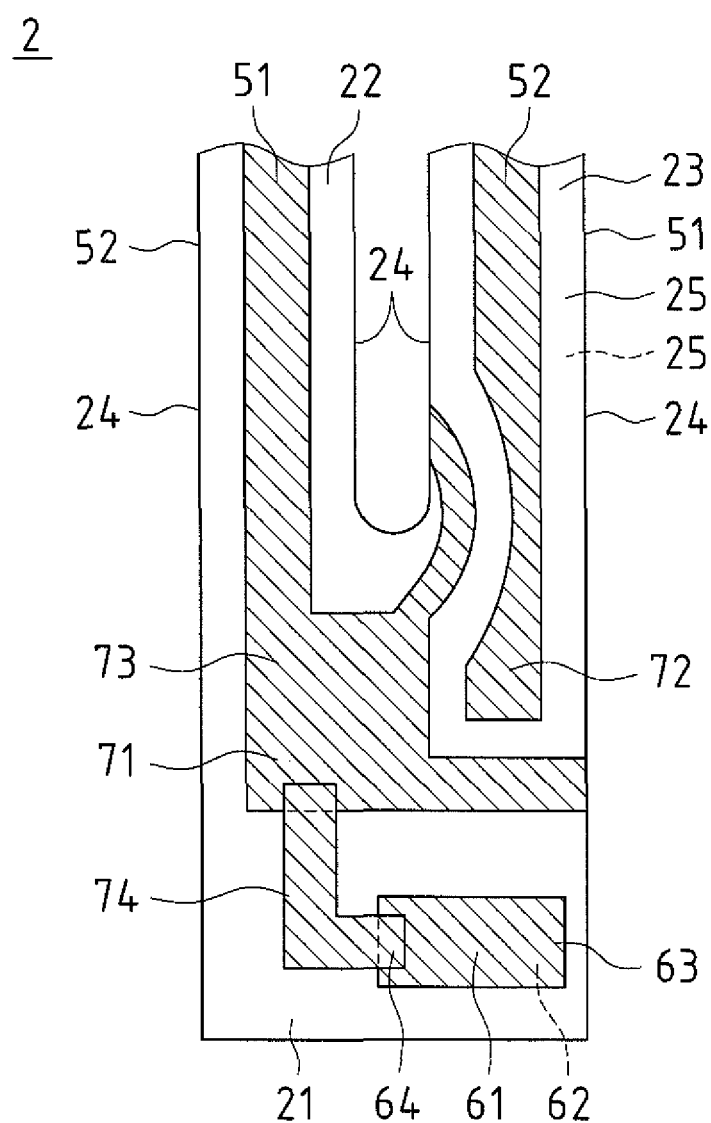
FIG. 2 is a schematic partial enlarged plan view of a crystal resonator plate, showing a pattern of extraction electrodes and terminal electrodes of the crystal resonator plate according to an embodiment.
Figure 3:
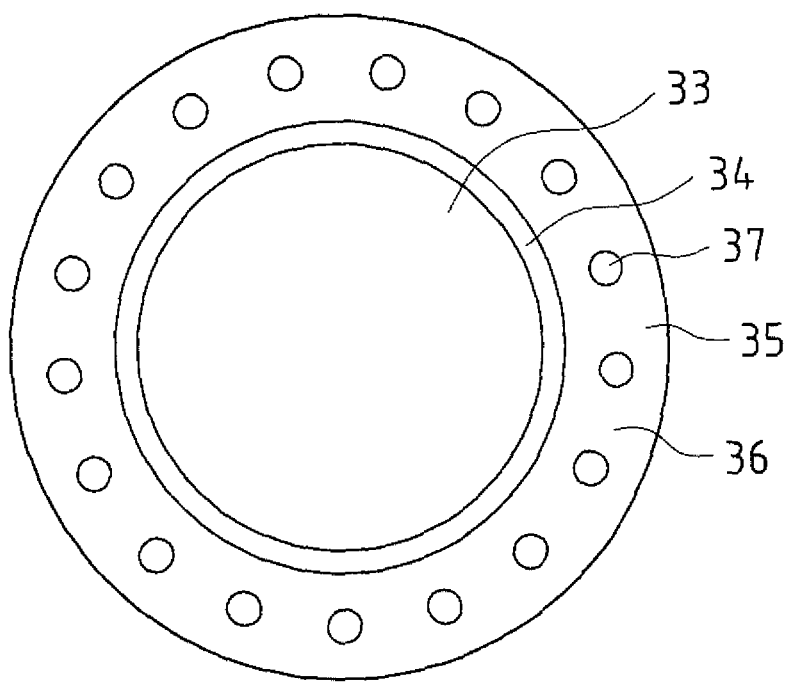
FIG. 3 is a cross-sectional view of a lead terminal, taken along line A-A in FIG. 1, according to the embodiment.

Next is a description of each constituent element of the crystal resonator 1 with reference to FIGS. 1 to 3.

Crystal Resonator Plate 2

The crystal resonator plate 2 is a crystal Z plate that is formed by wet etching from a crystal plate (not shown) made of an anisotropic material using photolithography, and such a crystal resonator plate 2 is suitable for mass production.

The crystal resonator plate 2 is constituted by a base portion 21, and two leg portions 22 and 23 serving as vibration portions, as shown in FIGS. 1 and 2. The two leg portions 22 and 23 are formed protruding from one side of the base portion 21 in the same direction. Because of a difference in etching speed in different crystal directions (X and Y directions) of the crystal when forming the crystal resonator plate 2 by wet etching, side faces 24 of the crystal resonator plate 2 are inclined relative to main surfaces 25 thereof, although not shown. Note that the crystal resonator plate 2 also may be processed by machining using a known wire saw, instead of being processed by wet etching using photolithography as described above.

Each of the leg portions 22 and 23 is provided with a pair of excitation electrodes 51 and 52 having different potentials, a pair of terminal electrodes 61 and 62 that is electrically connected to an external electrode (in the present embodiment, the pair of lead terminals 31 and 32), and a pair of extraction electrodes 71 and 72 that extracts the excitation electrodes 51 and 52 respectively to the terminal electrodes 61 and 62.

The excitation electrode 51 is formed on each main surface 25 of the leg portion 22 and each side face 24 of the leg portion 23, and the excitation electrode 52 is formed on each main surface 25 of the leg portion 23 and each side face 24 of the leg portion 22. These excitation electrodes 51 and 52 are made of thin films by first forming a Cr layer composed of Cr on the leg portions 22 and 23, then forming a Cr—Sn layer composed of Cr and Sn on the Cr layer, then forming an Sn layer composed of Sn on the Cr—Sn layer, and then forming an Ag layer composed of Ag on the Sn layer, all the layers being formed by metal deposition.

The extraction electrodes 71 and 72 are electrode patterns formed by being extracted from the excitation electrodes 51 and 52, each pattern being constituted by an electrode pattern that is formed simultaneously with the excitation electrodes 51 and 52 in the base portion 21 and the leg portions 22 and 23, and an electrode pattern that is not formed simultaneously with the excitation electrodes 51 and 52.

The electrode patterns of the extraction electrodes 71 and 72 that are simultaneously formed with the excitation electrodes 51 and 52 are formed on each main surface 25 and each side face 24 of the leg portions 22 and 23 and on each main surface 25 and each side face 24 of the base portion 21. These electrode patterns of the extraction electrodes 71 and 72 that are simultaneously formed with the excitation electrodes 51 and 52 are made of a thin film 73 configured by first forming a Cr layer composed of Cr on the leg portions 22 and 23 and on the base portion 21, then forming a Cr—Sn layer composed of Cr and Sn on the Cr layer, then forming an Sn layer composed of Sn on the Cr—Sn layer, and then forming an Ag layer composed of Ag on the Sn layer, all the layers being formed by metal deposition. The thin film 73 has the same thickness as the excitation electrodes 51 and 52.

The electrode patterns of the extraction electrodes 71 and 72 that are not simultaneously formed with the excitation electrodes 51 and 52 are made of a thin film 74 configured by forming a Cr layer composed of Cr on the base portion 21 by metal deposition. A part of the thin film 74 is formed on the thin film 73 as shown in FIG. 2.

The terminal electrode 61 is formed on one of the main surfaces 25 of the base portion 21, and the terminal electrode 62 is formed on the other main surface 25 of the base portion 21. These terminal electrodes 61 and 62 are formed on the main surfaces 25 of the base portion 21 without opposing each other. The terminal electrodes 61 and 62 are made of a thin film 63 and a thin film 64, the thin film 63 being configured by first forming a Cr layer composed of Cr on each main surface 25 of the base portion 21, then forming a Cr—Sn layer composed of Cr and Sn on the Cr layer, then forming an Sn layer composed of Sn on the Cr—Sn layer, and then forming an Ag layer composed of Ag on the Sn layer, all the layers being formed by metal deposition, and the thin film 64 being configured by forming a Cr layer composed of Cr on the thin film 63 and on the base portion 21 by metal deposition. The thin film 63 of the terminal electrodes 61 and 62 is formed on the base portion 21 simultaneously with the excitation electrodes 51 and 52 and the thin film 73 of the extraction electrodes 71 and 72, and has the same thickness as the excitation electrodes 51 and 52 and the thin film 73 of the extraction electrodes 71 and 72. The thin film 64 of the terminal electrodes 61 and 62 is formed on the base portion 21 simultaneously with the thin film 74 of the extraction electrodes 71 and 72, and has the same thickness as the thin film 74 of the extraction electrodes 71 and 72.

At a tip portion 26 of each of the leg portions 22 and 23 is formed a mass thin film 8 as a mass for the purpose of frequency adjustment as shown in FIG. 1. The mass thin films 8 are electrically connected to the excitation electrodes 51 and 52. The mass thin films 8 are made of a thin film configured by first forming a Cr layer composed of Cr on the leg portions 22 and 23, then forming a Cr—Sn layer composed of Cr and Sn on the Cr layer, then forming an Sn layer composed of Sn on the Cr—Sn layer, and then forming an Ag layer composed of Ag on the Sn layer, all layers being formed by metal deposition. The mass thin films 8 are formed on the leg portions 22 and 23 simultaneously with the excitation electrodes 51 and 52, and have the same thickness as the excitation electrodes 51 and 52.

Lead Terminals 31 and 32

The pair of lead terminals 31 and 32 are formed of a metal material in a long and narrow circular cylindrical shape as shown in FIG. 1 and are circular in cross section as shown in FIG. 3. As shown in FIG. 3, the lead terminals 31 and 32 each are constituted by a core portion 33 made of Kovar, and a bonding layer that is formed on the outer circumference of the core portion 33 so as to cover the core portion 33 and is electromechanically bonded to the crystal resonator plate 2 (the terminal electrodes 61 and 62). The bonding layer includes a first bonding layer 34 composed of Cu and a second bonding layer 35 formed on the outer circumference of the first bonding layer 34 so as to cover the first bonding layer 34. In the present embodiment, the core portion 33 has a diameter of 0.25 nm, the first bonding layer 34 has a thickness of 5 µm, and the second bonding layer 35 has a thickness of 10 µm. Note that portions of the lead terminals 31 and 32 that are hermetically sealed by the base 3 and the cap 4 are referred to as "inner leads", and portions thereof that are electrically connected to external equipment or the like are referred to as "outer leads".

The second bonding layer 35 is a lead-free Sn—Cu layer composed of Sn 36 and containing a metallic compound 37 of Sn and Cu as shown in FIG. 3, and is plated on the first bonding layer 34.

The second bonding layer 35 is in a Cu-rich state (7-13% of Cu). Accordingly, for the case where the base 3 and the cap 4 are bonded with each other with the base 3 and the cap 4 being in attachment under pressure, the base 3 and the cap 4 can be smoothly attached to each other under pressure, thereby providing hermetic sealing of the internal space 11. In contrast, if the Cu content of the second bonding layer 35 exceeds 13%, difficulties are encountered in smoothly attaching the base 3 and the cap 4 under pressure, thus causing a disturbance in the hermetic sealing of the internal space 11. If the Cu content of the second bonding layer 35 is less than 7%, difficulties are encountered in generating an intermetallic compound (see an intermetallic compound 91 described below), thus reducing the heat resistance of a bonding material 7.

Base 3

The base 3 is made of, for example, alloy 42 (an iron-nickel alloy) and formed in a short elliptic cylindrical shape as a whole as shown in FIG. 1. The surface of the base 3 is coated with Cu plating, which serves as a foundation layer, and is further coated with Sn—Cu plating, which serves as an upper layer, by electroplating, for example.

In the central portion of the base 3, a hole portion 39 is formed in which the lead terminals 31 and 32 are implanted. With the lead terminals 31 and 32 passing through the hole portion 39, electrical glass 38 is filled in the hole portion and hardened so that the lead terminals 31 and 32 are implanted in the base 3 via the electrical glass 38. By implanting the lead terminals 31 and 32 in the central portion of the base 3 via the electrical glass 38 in this way, the lead terminals 31 and 32 are made electrically independent of the base 3. Furthermore, the lead terminals 31 and 32 are also coated with Cu plating, which corresponds to the first bonding layer 34, and are further coated with Sn—Cu plating, which serves as an upper layer by electroplating, for example. Note that in the case of Sn—Cu plating, an intermetallic compound 37 of Sn and Cu exists from the time when plating is being performed.

Cap

The cap 4 is made of, for example, nickel silver (a Cu—Ni—Zn alloy) and formed in a hollow elliptic cylindrical shape with an open bottom face. On the surface of the cap 4, a film composed of Ni for preventing corrosion (not shown) is formed by a method such as plating.

With the crystal resonator 1 having the above-described configuration, the crystal resonator plate 2 is electromechanically bonded to only the lead terminals 31 and 32, the cap 4 is disposed on the base 3 so as to cover the crystal resonator plate 2, which has been electromechanically bonded to the lead terminals 31 and 32, and with the base 3 and the cap 4 attached to each other under pressure, the base 3 and the cap 4 are bonded to each other by, for example, resistance welding so as to hermetically seal the crystal resonator plate 2. The bonding between the crystal resonator plate 2 and the lead terminals 31 and 32 at this time is described below.

Bonding between Crystal resonator plate 2 and Lead Terminals 31, 32

Figure 4:
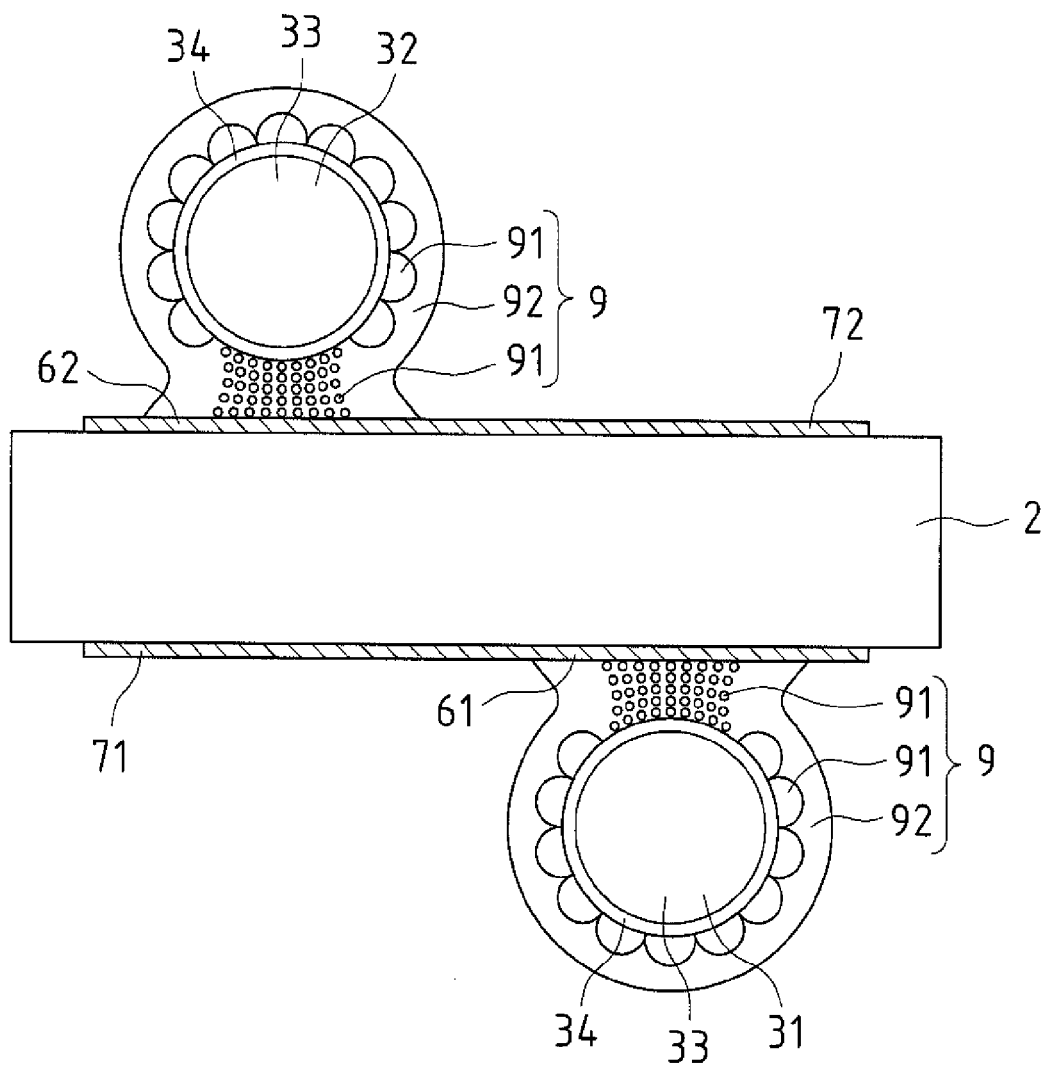
FIG. 4 is an enlarged cross-sectional view taken along line B-B in FIG. 1, showing how the crystal resonator plate and the lead terminals according to the embodiment are connected to one another.
Figure 5:
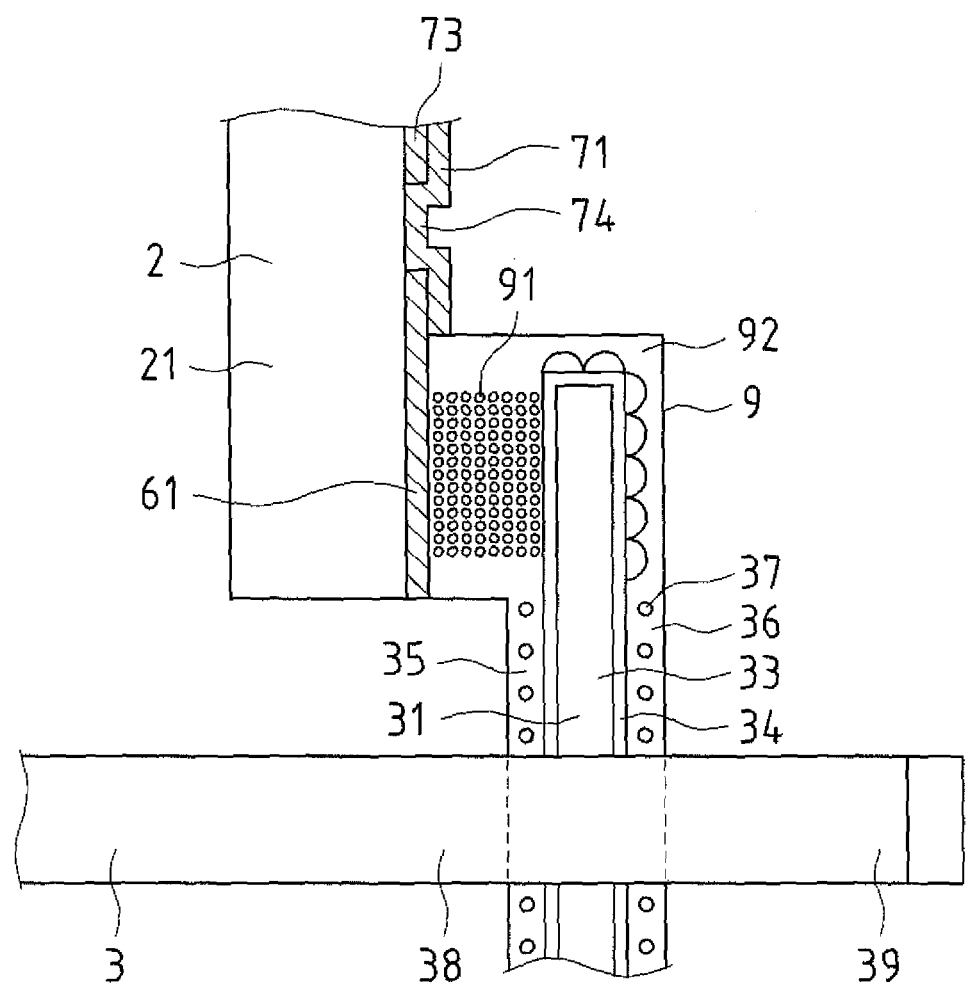
FIG. 5 is a schematic side view showing how the crystal resonator plate and a lead terminal are connected to each other according to the embodiment.

The crystal resonator plate 2 and the lead terminals 31 and 32 are electromechanically bonded to each other by parts of the terminal electrodes 61 and 62 of the crystal resonator plate 2, parts of the first bonding layers 34 of the lead terminals 31 and 32, and the second bonding layers 35. With this bonding, the terminal electrodes 61 and 62, the first bonding layers 34, and the second bonding layers 35 form a bonding material 9 that contains an Sn—Cu alloy (the Sn—Cu intermetallic compound 91), and the intermetallic compounds 37 in the second bonding layers 35 gather (i.e., are eccentrically-located) in the narrowest gaps between the crystal resonator plate 2 (more specifically, the lowermost Cr layer of the terminal electrodes 61 and 62) and the lead terminals 31 and 32 (more specifically, the first bonding layers 34). Specifically, as shown in FIGS. 4 and 5, intermetallic bonding is achieved between Sn of the terminal electrodes 61 and 62 of the crystal resonator plate 2 shown in FIG. 2 and Cu and Sn of the second bonding layers 35 of the lead terminals 31 and 32 shown in FIG. 3, which produces the bonding material 9 containing the Sn—Cu intermetallic compound 91. It is assumed that the narrowest gap between the crystal resonator plate 2 and the lead terminals 31 and 32 via the bonding material 9 is in the range of 3 to 20 μm.

Turning now to the process of bonding the crystal resonator plate 2 and the lead terminals 31 and 32, the crystal resonator plate 2 is adhered by a soft beam to the lead terminals 31 and 32 implanted in the base 3, so the crystal resonator plate 2 is electrically bonded to the lead terminals 31 and 32. Thereafter, heat treatment is performed at 200 to 230 degrees for several hours under a nitrogen gas atmosphere, so as to form the bonding material 9 by which the crystal resonator plate 2 and the lead terminals 31 and 32 are bonded to each other as shown in FIGS. 4 and 5.

The melting point of bonding material 9 is higher than the environmental temperature (e.g., 260° C. or above) at the time of reflow. With this bonding material 9, the Sn—Cu intermetallic compound 91 is eccentrically-located in the vicinity of the first bonding layers 34 of the lead terminals 31 and 32 and in the narrowest gaps between the crystal resonator plate 2 and the lead terminals 31 and 32 and their vicinity. At the other sites of the bonding material 9 (sites other than where the Sn—Cu intermetallic compound 91 has been generated), Sn 92 that has no intermetallic bonding to Cu is eccentrically-located. Specifically, Sn 92 is eccentrically-located on the outer side of the Sn—Cu intermetallic compound 91 formed on the outer circumference of the first bonding layers 34 of the lead terminals 31 and 32, and at positions located between the crystal resonator plate 2 and the lead terminals 31 and 32, but other than in the vicinity of the narrowest gaps.

Figure 6:
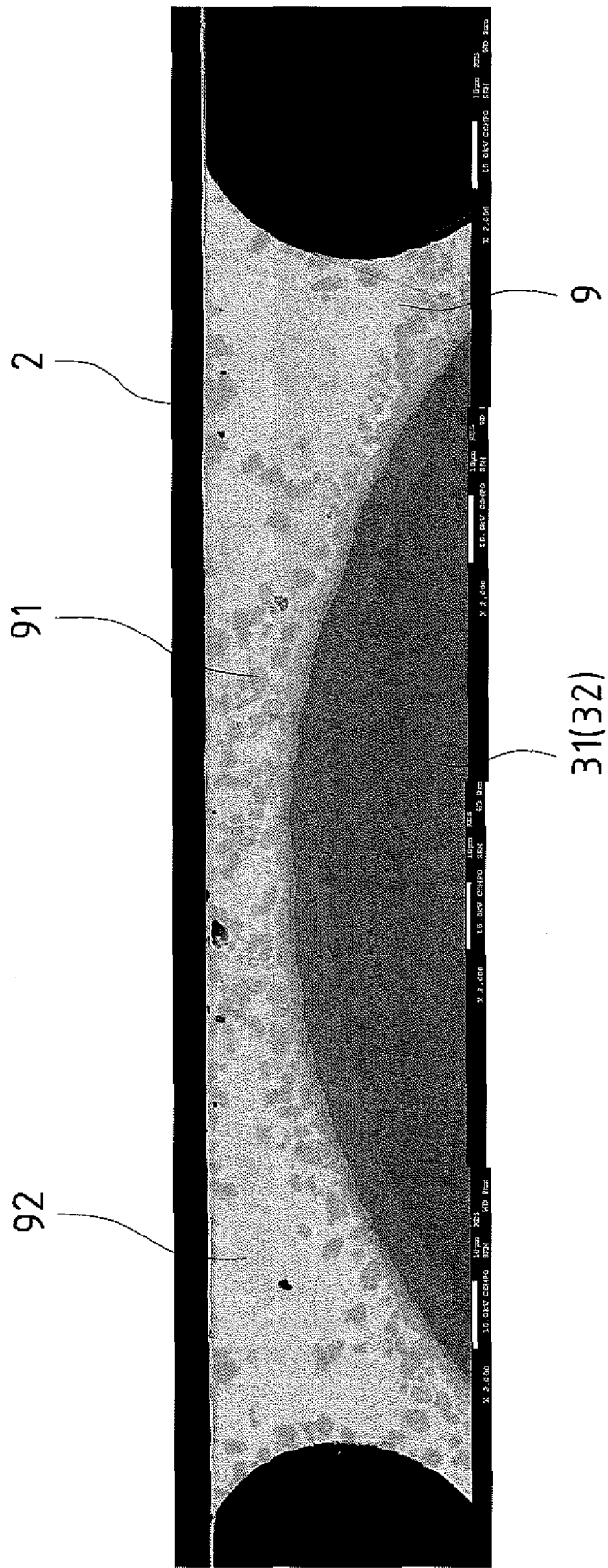
FIG. 6 shows an SEM image according to an example in which a crystal resonator plate and a lead terminal are connected to each other.

FIG. 6 shows an example of the bonding material 9 formed by the above-described bonding between the crystal resonator plate 2 and the lead terminals 31 and 32 described above.

In the example shown in FIG. 6, a light-colored portion of the bonding material 9, by which the crystal resonator plate 2 and the lead terminals 31 and 32 are bonded to each other, corresponds to Sn 92, and a dark-colored portion corresponds to the Sn—Cu intermetallic compound 91. Note that in the example of FIG. 6, the narrowest gaps between the crystal resonator plate 2 and the lead terminals 31 and 32 are in the range of approximately 12 to 13 μm.

With the crystal resonator 1 according to the present embodiment, because the terminal electrodes 61 and 62 and the bonding layer (the first bonding layer 34 and the second bonding layer 35) are at least bonded to each other by the bonding material 9 that contains an intermetallic compound (the Sn—Cu intermetallic compound 91) having a higher melting temperature than lead-free solder or the like, the heat resistance of the bonding material 9 can be improved. Thus, at least the Sn—Cu intermetallic compound 91 enables the lead terminals 31 and 32 to support the crystal resonator plate 2 even at the time of reflow. For this reason, according to the present embodiment, the bonding material 9 containing the Sn—Cu intermetallic compound 91 can suppress detachment of the crystal resonator plate 2 from the lead terminals 31 and 32 even at the time of reflow. Furthermore, according to the present embodiment, since a resin adhesive as used in conventional technologies is not used for supporting the crystal resonator plate 2 by the lead terminals 31 and 32, it is possible to suppress degradation in the characteristics of the crystal resonator 1.

Incidentally, in the case where a conductive adhesive is used to bond the crystal resonator plate 2 to the lead terminals 31 and 32 unlike in the present embodiment, it is actually possible to suppress detachment of the crystal resonator plate 2 from the lead terminals 31 and 32 even at the time of reflow. However, if a conductive adhesive is used to bond the crystal resonator plate 2 to the lead terminals 31 and 32, the conductive adhesive produces a gas, and the produced gas causes degradation in the vibration characteristics of the crystal resonator plate 2. For this reason, it is unfavorable to use a conductive adhesive as means for bonding the lead terminals 31 and 32 and the crystal resonator plate 2.

Furthermore, since the intermetallic compound (the Sn—Cu intermetallic compound 91) is eccentrically-located in the narrowest gaps between the crystal resonator plate 2 and the lead terminals 31 and 32 and their vicinity, the Sn—Cu intermetallic compound 91 enables electromechanical bonding between the crystal resonator plate 2 and the lead terminals 31 and 32 while withstanding the environmental temperature at the time of reflow.

Furthermore, the narrowest gaps of 3 to 20 μm between the crystal resonator plate 2 and the lead terminals 31 and 32 enable the Sn—Cu intermetallic compound 91 to be eccentrically-located in the narrowest gaps in good condition and further enable the bonding material 9 to be kept in a fillet shape, which is favorable for bonding. Therefore, according to the present embodiment, the crystal resonator plate 2 and the lead terminals 31 and 32 can be firmly bonded to each other via the bonding material 9 containing the Sn—Cu intermetallic compound 91, which is preferable for reducing the size of the crystal resonator 1. In contrast, the narrowest gap of less than 3 μm makes the gap portions fragile and thereby reduces the strength of the bonding material 9. Also, the narrowest gap of more than 20 μm makes small the fillet of the bonding material 9 formed on the crystal resonator plate 2 side and thereby reduces the strength of bonding between the crystal resonator plate 2 and the lead terminals 31 and 32. This may further relatively reduce the amount of the Sn—Cu intermetallic compound 91 generated in the bonding material 9, thus reducing heat resistance.

Furthermore, since the bonding layer (the first bonding layer 34 and the second bonding layer 35) contains Cu and Sn, Cu and Sn dispersed in the bonding layer are linked to each other (e.g., $Cu_6Sn_5$ or $Cu_3Sn$) in bonding the terminal electrodes 61 and 62 and the bonding layer, and accordingly the Sn—Cu intermetallic compound 91 of Cu and Sn is eccentrically-located. In the case where Cu and Sn of the bonding layer have already been linked to each other (in the case where the Sn—Cu intermetallic compound 91 already exists in the second bonding layer 35), this Sn—Cu intermetallic compound 91 of Cu and Sn is eccentrically-located.

Furthermore, since the bonding layer is configured by the first bonding layer 34 composed of Cu and the second bonding layer 35 composed of Cu and Sn and formed on the first bonding layer 34, Cu of the first bonding layer 34 is supplied to Sn of the second bonding layer 35 during bonding (during heating). This consequently accelerates generation of a new intermetallic compound (the Sn—Cu intermetallic compound 91), thus improving the heat resistance of the bonding material 9.

Furthermore, since a Cu layer composed of Cu is formed as the uppermost layer of the terminal electrodes 61 and 62, the Sn of the bonding layer is diffused into the Cu layer of the terminal electrodes 61 and 62 in bonding the terminal electrodes 61 and 62 and the bonding layer (the first bonding layer 34 and the second bonding layer 35), and accordingly the Sn of the bonding layer and the Cu of the Cu layer of the terminal electrodes 61 and 62 produce the Sn—Cu intermetallic compound 91 that has heat resistance to the environmental temperature at the time of reflow.

Note that a recessed portion may be formed on each main surface 25 of the leg portions 22 and 23 of the crystal resonator plate 2 according to the present embodiment in order to improve series resonant resistance (in the present embodiment, a CI value) that can be degraded due to a reduction in the size of the crystal resonator plate 2, and parts of the excitation electrodes 51 and 52 may be formed inside the recessed portions. In this case, even if the crystal resonator plate 2 is reduced in size, it is possible to suppress vibration loss of the leg portions 22 and 23 and to thereby keep the CI value to a low value.

Furthermore, although the excitation electrodes 51 and 52 according to the present embodiment are made of a thin film configured by laminating first a Cr layer, then a Cr—Sn layer, then a Sn layer, and then an Ag layer, the present invention is not intended to be limited thereto, and the excitation electrodes may be made of a thin film configured by laminating first a Cr layer composed of Cr and then an Au layer composed of Au. Alternatively, a configuration is also possible in which the excitation electrodes are made of a thin film configured by first forming a Cr layer composed of Cr, then forming a Cr—Ag layer composed of Cr and Ag, and then forming an Ag layer composed of Ag.

Furthermore, although the extraction electrodes 71 and 72 according to the present embodiment are made of a thin film having two different patterns, the present invention is not intended to be limited thereto, and the extraction electrodes may be made of a thin film having a single pattern. Furthermore, although the extraction electrodes 71 and 72 are made of a thin film configured by laminating first a Cr layer, then a Cr—Sn layer, then an Sn layer, and then an Ag layer or of a thin film configured of a Cr layer, the present invention is not intended to be limited thereto, and the extraction electrodes may be made of a thin film configured by laminating first a Cr layer composed of Cr and then an Au layer composed of Au.

Furthermore, although the bonding layer is configured by the first bonding layer 34 and the second bonding layer 35 in the present embodiment, the present invention is not intended to be limited thereto, and the bonding layer may take other configurations as long as it is a layer composed of Cu and Sn.

Furthermore, although Cr is used for the terminal electrodes 61 and 62 of the crystal resonator plate 2 in the present embodiment, the present invention is not intended to be limited thereto, and Ni may be used instead of Cr.

Furthermore, although the terminal electrodes 61 and 62 are formed by laminating first a Cr layer, then a Cr—Sn layer, then an Sn layer, and then an Ag layer on the base portion 21 of the base 3 in the present embodiment, the present invention is not intended to be limited thereto, and an Ag—Cu layer configured by an Ag layer containing Cu may be used instead of the Ag layer.

Furthermore, although the terminal electrodes 61 and 62 according to the present embodiment are made of a thin film having two different patterns, the present invention is not intended to be limited thereto, and the terminal electrodes may be made of a thin film having a single pattern (e.g., the thin film 63).

Furthermore, although the thin film 63 of the terminal electrodes 61 and 62 are formed by laminating first a Cr layer, then a Cr—Sn layer, then an Sn layer, and then an Ag layer on the base portion 21 of the base 3 in the present embodiment, the present invention is not intended to be limited thereto, a Cu layer composed of Cu may be further laminated on the Ag layer.

Figure 7:
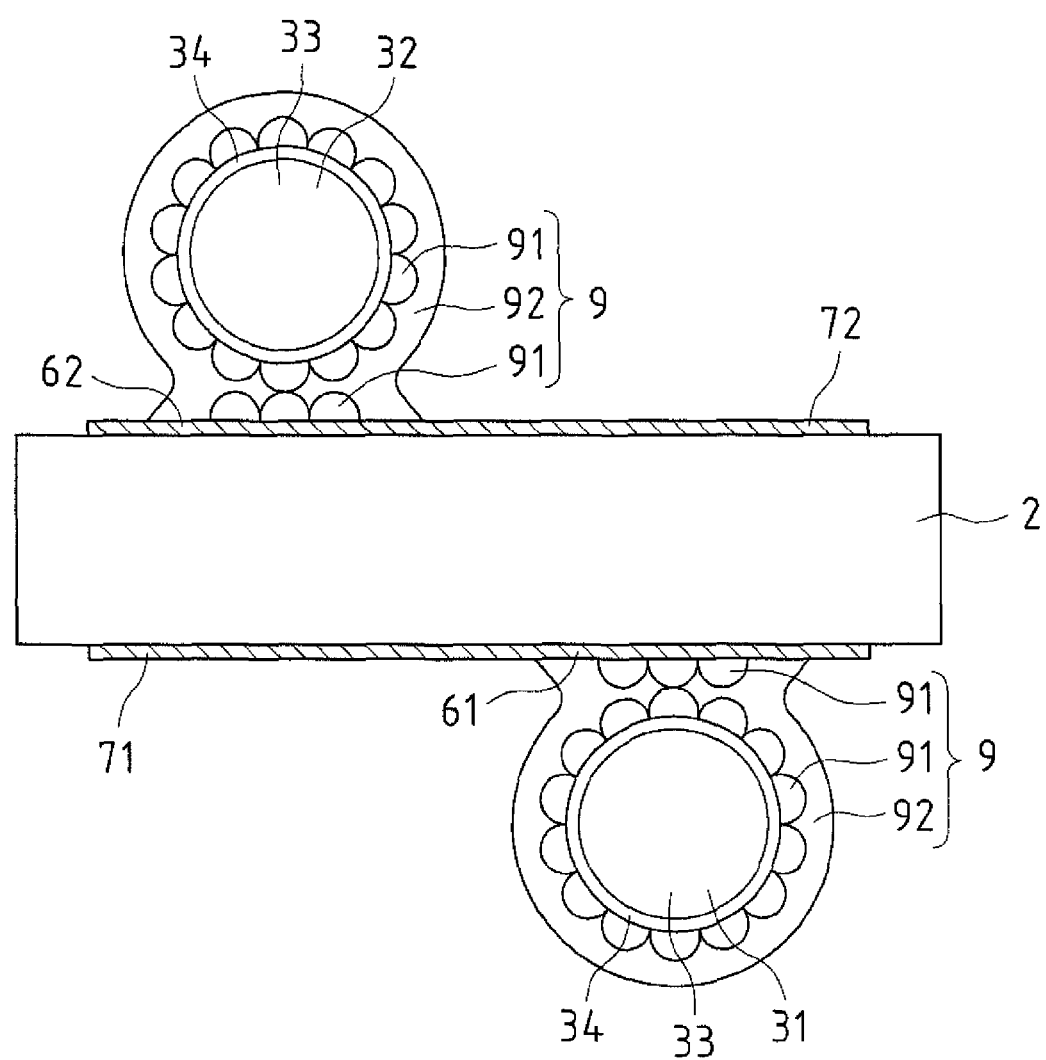
FIG. 7 is an enlarged cross-sectional view, which corresponds to FIG. 4, showing how a crystal resonator plate and lead terminals according to another embodiment are connected to one another.

In this case, since a Cu layer is formed as the uppermost layer of the terminal electrodes 61 and 62, Sn 36 of the bonding layer is diffused into the Cu layer of the terminal electrodes 61 and 62 in bonding the terminal electrodes 61 and 62 and the bonding layer (the first bonding layer 34 and the second bonding layer 35), and accordingly, Sn of the bonding layer and Cu of the Cu layer of the terminal electrodes 61 and 62 produce an intermetallic compound (the Sn—Cu intermetallic compound 91) having heat resistance. A state of bonding between the crystal resonator plate 2 and the lead terminals 31 and 32 with this configuration is shown in the schematic diagram of FIG. 7. It can be seen from a comparison between the state of bonding shown in FIG. 7 and the state of bonding shown in FIG. 4 that the way in which the Sn—Cu intermetallic compound 91 is eccentrically-located in the narrowest gaps between the crystal resonator plate 2 and the lead terminals 31 and 32 and their vicinity is more preferable in the case of the bonding material 9 being in the state of bonding shown in FIG. 7. Accordingly, the bonding material 9 in the state of bonding shown in FIG. 7 has higher heat resistance and is thus more preferable than the bonding material in the state of bonding shown in FIG. 4.

Furthermore, although the thin film 63 of the terminal electrodes 61 and 62 is formed by laminating first a Cr layer, then a Cr—Sn layer, then an Sn layer, and then an Ag layer on the base portion 21 of the base 3 in the present embodiment, the present invention is not intended to be limited thereto, and a barrier layer for blocking diffusion of Sn may be formed between the Cr layer and the Cr—Sn layer. One favorable example of the barrier layer is a Cr—Ag layer composed of Cr and Ag. With this configuration, Ag exists between the crystal resonator plate 2 and the Sn—Cu intermetallic compound 91 after intermetallic bonding is achieved between the lead terminals 31 and 32 and the crystal resonator plate 2.

Figure 8:
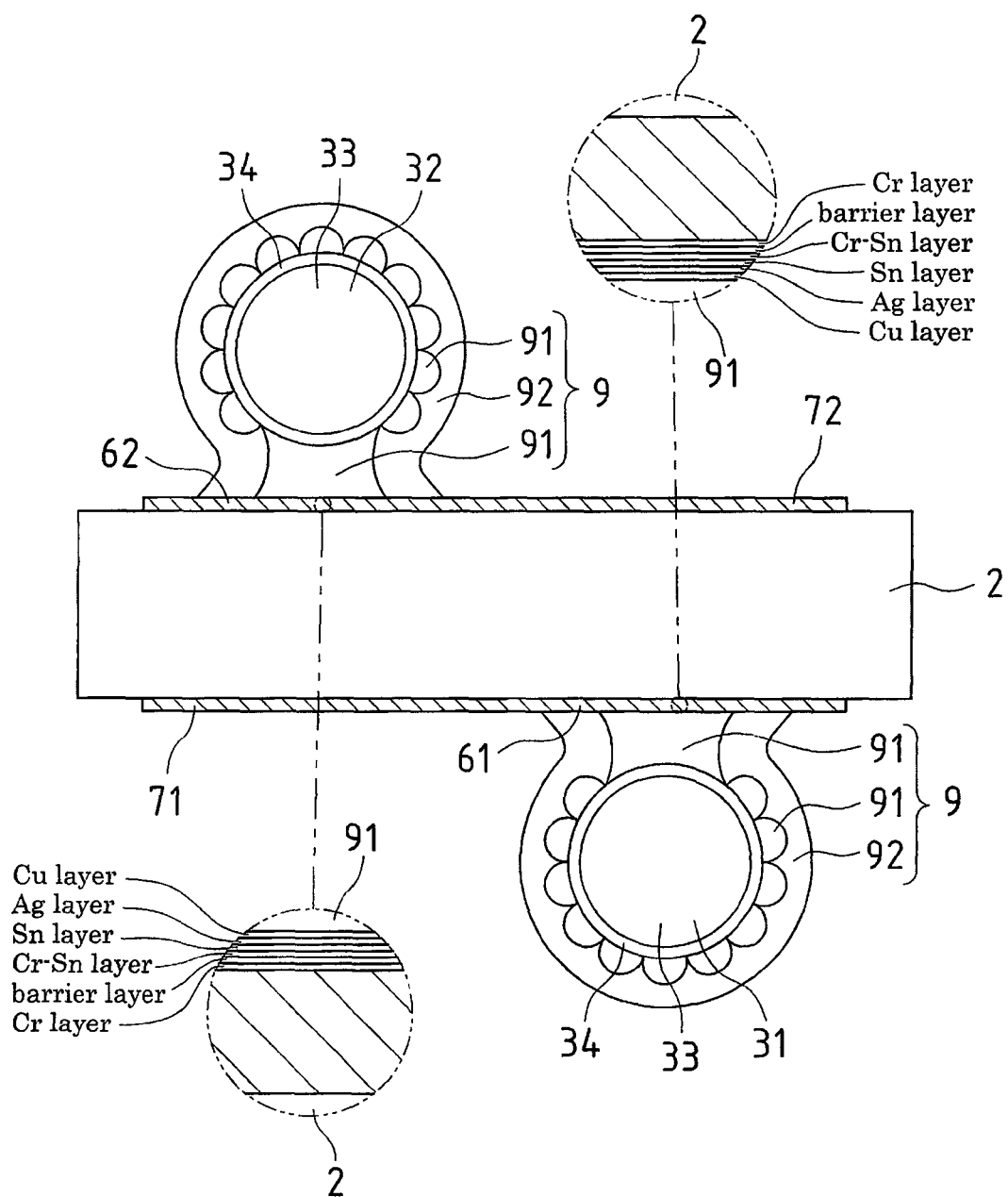
FIG. 8 is an enlarged cross-sectional view, which corresponds to FIG. 4, showing how a crystal resonator plate and lead terminals according to another embodiment are connected to one another.

In this case, since the terminal electrodes 61 and 62 have a barrier layer formed between their Cr layer and Cr—Sn layer, the barrier layer prevents Sn 36 of the bonding layer (the first bonding layer 34 and the second bonding layer 35) of the lead terminals 31 and 32 from diffusing into the Cr layer of the terminal electrodes 61 and 62 in bonding the terminal electrodes 61 and 62 and the bonding layer. This consequently prevents Sn 36 of the bonding layer and Sn of the terminal electrodes 61 and 62 from eroding the undermost Cr layer of the terminal electrodes 61 and 62 from the crystal resonator plate 2, thus suppressing exfoliation of the terminal electrodes 61 and 62 from the crystal resonator plate 2 which may be caused by erosion of the Cr layer due to Sn. A state of bonding between the crystal resonator plate 2 and the lead terminals 31 and 32 with this configuration is shown in the schematic diagram of FIG. 8. It can be seen from a comparison between the state of bonding shown in FIG. 8 and the state of bonding shown in FIG. 4 that the way in which the Sn—Cu intermetallic compound 91 is eccentrically-located in the narrowest gaps between the crystal resonator plate 2 and the lead terminals 31 and 32 and their vicinity is more preferable in the case of the bonding material 9 being in the state of bonding shown in FIG. 8. Accordingly, the bonding material 9 in the state of bonding shown in FIG. 8 has higher resistance and is thus more preferable than the bonding material in the state of bonding shown in FIG. 4.

Furthermore, although the narrowest gaps between the crystal resonator plate 2 and the lead terminals 31 and 32 are the narrowest gaps between the undermost Cr layers of the terminal electrodes 61 and 62 of the crystal resonator plate 2 and the first bonding layers 34 of the lead terminals 31 and 32 in the present embodiment, the present invention is not intended to be limited thereto. Note that the narrowest gaps between the crystal resonator plate 2 and the lead terminals 31 and 32 refer to gaps between a portion of the crystal resonator plate 2 in which no metallic compound (in the present embodiment, Sn—Cu) is generated, and the lead terminals 31 and 32.

Furthermore, it is desirable for the bonding material 9 according to the present embodiment to further contain Ni or Co. In this case, even if there is a thermal hysteresis (e.g., a reflow test or age thermal hysteresis) after generation of the bonding material 9, the presence of Ni or Co prevents Sn of the bonding material 9 from reacting with the terminal electrodes 61 and 62 and thereby eroding the terminal electrodes 61 and 62. This consequently suppresses exfoliation of the bonding material 9 from the crystal resonator plate 2. One example of a specific embodiment is that a metal layer of Ni or Co is formed as the uppermost layer of the terminal electrodes 61 and 62 before generation of the bonding material 9. Note that a configuration is also possible in which such Ni or Co may be contained in the terminal electrodes 61 and 62 (e.g., may be formed as an intermediate layer of the terminal electrodes 61 and 62), instead of being formed as the uppermost layer.

Furthermore, it is desirable for the bonding material 9 according to the present embodiment to further contain Au or Ag. In this case, even if there is a thermal hysteresis (e.g., a reflow test or age thermal hysteresis) after generation of the bonding material 9, the presence of Au or Ag causes Sn of the bonding material 9 to react first with Au or Ag and thereby suppresses reaction of Sn with the metallic material of the terminal electrodes 61 and 62. This consequently suppresses exfoliation of the bonding material 9 from the crystal resonator plate 2. Examples of a specific embodiment include a configuration in which Au or Ag is formed as the uppermost layer of the terminal electrodes 61 and 62 before generation of the bonding material 9, and a configuration in which Au or Ag is formed in the surfaces of the lead terminals 31 and 32. Note that such Au or Ag may be formed by a method such as plating, vacuum evaporation, or evaporation, or may be formed by coating an Au paste or an Ag paste.

Furthermore, it is desirable to form a metal layer of Au or Ag or Cu on the surface of the bonding material 9 according to the present embodiment. In this case, even if there is a thermal hysteresis (e.g., a reflow test or age thermal hysteresis) after generation of the bonding material 9, the presence of Au or Ag or Cu causes Sn of the bonding material 9 to react first with Au or Ag or Cu and thereby suppresses reaction of Sn with the terminal electrodes 61 and 62. This consequently suppresses exfoliation of the bonding material 9 from the crystal resonator plate 2. One example of a specific embodiment is that after generation of the bonding material 9, a metal layer of Au or Ag or Cu may be formed on the bonding material 9. Note that such Au or Ag or Cu may be formed by a method such as plating, vacuum evaporation, or evaporation, or may be formed by coating a paste containing such metal.

Furthermore, regarding the terminal electrodes 61 and 62 according to the present embodiment, although first a Cr layer, then a Cr—Sn layer, then an Sn layer, and then an Ag layer are formed on each main surface 25 of the base portion 21, the present invention is not intended to be limited thereto, and other configurations are also possible, such as a configuration in which first a Cr layer, then a Cr—Ag layer, then an Ag layer, and then a Cu layer are formed on each main surface 25 of the base portion 21, or a configuration in which first a Cr layer, then a Cr—Ag layer, then an Ag layer, then a Cu layer, and then an Ag layer are formed on each main surface 25 of the base portion 21. In this case, since Sn is not contained in the terminal electrodes 61 and 62, it is possible to solve the problem caused by Sn (e.g., erosion due to Sn).

Furthermore, the pattern of the crystal resonator plate 2 according to the present embodiment is not limited to the example described above, and other patterns, such as shown in FIGS. 9 and 10, may be used.

The excitation electrodes 51 are extracted by the extraction electrodes 71 to the terminal electrodes 61, and the extraction electrodes 71 are connected to the terminal electrodes 61 via the thin film 74 formed on the front-side main surface 25 and the thin film 75 formed on the side faces 24. The thin films 74 and 75 herein have the same configuration and are made of a material having lower wettability than the excitation electrodes 51 and the extraction electrodes 71. Specifically, Cr is used in an embodiment shown in FIGS. 9 and 10. Here, "having lower wettability" refers to the relative fact that the wettability of the thin films is lower as that of the excitation electrode 51 and the extraction electrode 71.

Figure 9:
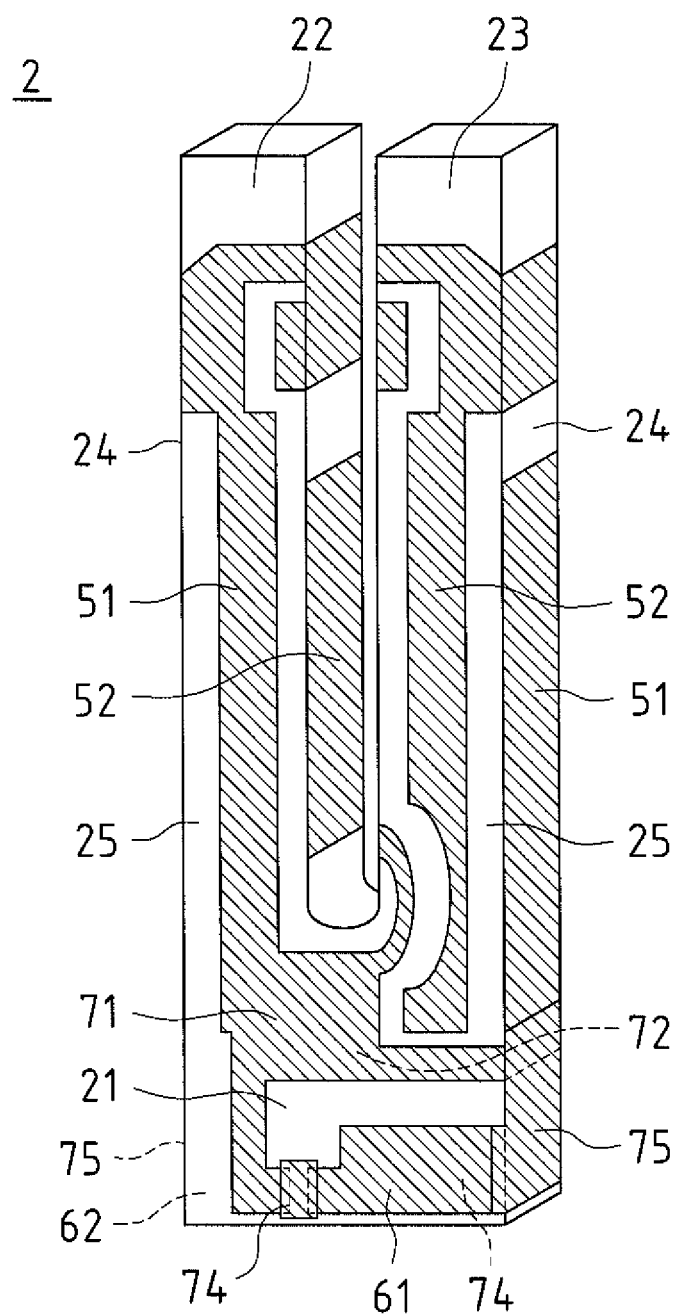
FIG. 9 is a schematic perspective view of a crystal resonator plate, showing a pattern of extraction electrodes and terminal electrodes formed in the front-side main surface of the crystal resonator plate according to another embodiment.
Figure 10:
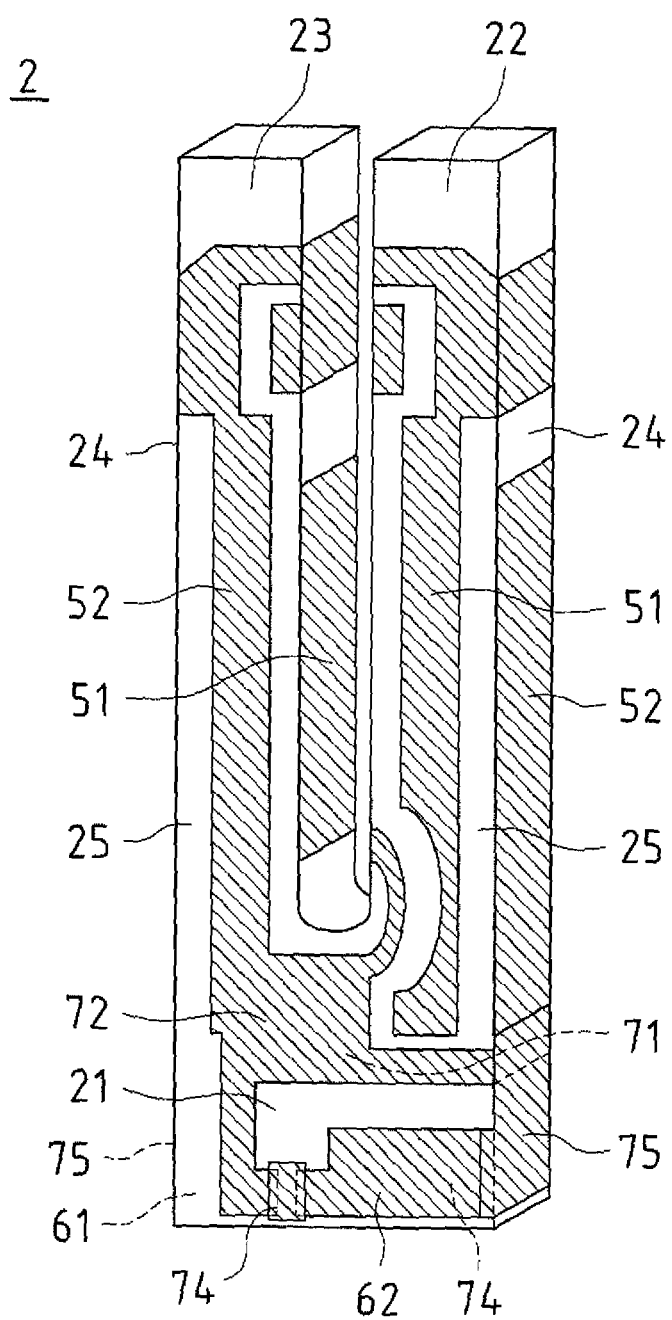
FIG. 10 is a schematic perspective view of a crystal resonator plate, showing a pattern of the extraction electrodes and the terminal electrodes formed in the rear-side main surface of the crystal resonator plate according to the other embodiment.

Furthermore, as shown in FIGS. 9 and 10, the thin films 74 and 75 are formed on the main surfaces 25 or the side faces 24, overlapping respectively with the extraction electrodes 71 and the terminal electrodes 61.

As shown in FIG. 10, the excitation electrodes 52, the extraction electrodes 72, and the terminal electrodes 62 are formed on the rear-side main surface 25 and the side faces 24, have configurations symmetrical to the excitation electrodes 51, the extraction electrodes 71, and the terminal electrodes 61, described above, and are made of the same material as the excitation electrodes 51, the extraction electrodes 71, and the terminal electrodes 61, described above. Therefore, descriptions thereof have been omitted herein. Note that the thin films 74 and 75 are used to connect the extraction electrodes 72 and the terminal electrodes 62.

In a pattern as shown in FIGS. 9 and 10, the formation of the thin films 74 and 75 on the base portion 21 suppresses the possibility that Sn of the bonding material 9 erodes the excitation electrodes 51 and 52 (including the extraction electrodes 71 and 72) from the terminal electrodes 61 and 62 via the thin films 74 and 75.

Incidentally, the process of manufacturing the crystal resonator plate 2 by, for example, machining may include an automatic balancing process of making a rough frequency adjustment by grinding the tips of the leg portions 22 and 23 of the crystal resonator plate 2 before equipping the base 3, and thereby adjusting the weight balance of the leg portions 22 and 23. In implementing this automatic balancing process, an electrode terminal of a jig is brought in contact with only the thin film 75 formed on the side faces 24, which are made primarily of Cr and thus have excellent resistance to scratch, so that not damage is given to the terminal electrodes 61 and 62, the excitation electrodes 51 and 52, and the extraction electrodes 71 and 72, which are made primarily of Ag or Au and are thus highly conductive. As a result, the terminal electrodes 61 and 62 that are undamaged and have excellent conductivity can be bonded in the case where the crystal resonator plate 2 is fixedly attached to the lead terminals 31 and 32 of the base 3.

The present invention can be reduced to practice in various other forms without departing from its spirit or essential features. For this reason, the above-described exemplary embodiments are to all intents and purposes merely illustrative and should not be construed as limiting. The scope of the present invention is defined by the claims and is not in any way restricted by the descriptions of the specification. Furthermore, all variations and modifications of the claims within the scope of equivalency fall within the scope of the present invention.

Also, this application claims prior right on the basis of Japanese Patent Application No. 2009-276718 filed in Japan on Dec. 4, 2009, the content of which is hereby incorporated in its entirety by reference herein.

INDUSTRIAL APPLICABILITY

The present invention is preferable to a piezoelectric resonator device using crystal.

DESCRIPTION OF REFERENCE NUMERALS

1 Crystal resonator
11 Internal space
2 Crystal resonator plate
21 Base portion
22, 23 Leg portion
24 Side face
25 Main surface
26 Tip portion
3 Base
31, 32 Lead terminal
33 Core portion
34 First bonding layer
35 Second bonding layer
36 Sn
37 Metallic compound
38 Electrical glass
39 Hole portion
4 Cap
51, 52 Excitation electrode
61, 62 Terminal electrode
63 Thin film
64 Thin film
71, 72 Extraction electrode
73 Thin film
74 Thin film
75 Thin film
8 Mass thin film
9 Bonding material
91 Sn—Cu intermetallic compound
92 Sn

The invention claimed is:

1. A lead type piezoelectric resonator device comprising:
a piezoelectric resonator plate, and a lead terminal that supports the piezoelectric resonator plate and has a circular cross-section,
the piezoelectric resonator plate being provided with a terminal electrode that is electrically connected to the lead terminal, and
the lead terminal being constituted by a core portion and a bonding layer that is formed on an outer circumference of the core portion so as to cover the core portion and electromechanically bonded to the piezoelectric resonator plate,
wherein the piezoelectric resonator plate and the lead terminal are electromechanically bonded to each other by the terminal electrode and the bonding layer,
a bonding material that contains an intermetallic compound is produced from the terminal electrode and the bonding layer by the bonding of the terminal electrode and the bonding layer, and
the intermetallic compound is eccentrically distributed in a narrowest spacing between the piezoelectric resonator plate and the lead terminal and in a vicinity of the spacing in comparison with an area that surrounds the vicinity.

2. The lead type piezoelectric resonator device according to claim 1, wherein the narrowest gap between the piezoelectric resonator plate and the lead terminals is in the range of 3 to 20 µm.

3. The lead type piezoelectric resonator device according to claim 1, wherein the bonding layer contains Cu and Sn.

4. A lead type piezoelectric resonator device according to claim 3, wherein the bonding layer includes a first bonding layer made of Cu and a second bonding layer made of Cu and Sn and formed on the first bonding layer.

5. A lead type piezoelectric resonator device according to claim 3, wherein a Cu layer made of Cu is formed as an uppermost layer of the terminal electrode.

6. A lead type piezoelectric resonator device according to claim 5, wherein the terminal electrode has a barrier layer for blocking diffusion of Sn formed between a Cr layer and a Cr—Sn layer.

7. A lead type piezoelectric resonator device according to claim 1, wherein
the bonding material contains Sn, and
the piezoelectric resonator plate is provided with an excitation electrode that is connected to the terminal electrode via a thin film having lower wettability than the excitation electrode.

8. A lead type piezoelectric resonator device comprising:
a piezoelectric resonator plate, and a lead terminal that supports the piezoelectric resonator plate and has a circular cross-section,
the piezoelectric resonator plate being provided with a terminal electrode that is electrically connected to the lead terminal, and
the lead terminal being constituted by a core portion and a bonding layer that is formed on an outer circumference of the core portion so as to cover the core portion and electromechanically bonded to the piezoelectric resonator plate,
wherein the piezoelectric resonator plate and the lead terminal are electromechanically bonded to each other by the terminal electrode and the bonding layer, and
a bonding material that contains an intermetallic compound is produced from the terminal electrode and the bonding layer by the bonding of the terminal electrode and the bonding layer, and
the intermetallic compound is eccentrically distributed in a narrowest spacing between the piezoelectric resonator plate and the lead terminal and in a vicinity of the spacing in comparison with an area that surrounds the vicinity so as to minimize heat transfer between the piezoelectric resonator plate and the lead terminal.

* * * * *